(12) United States Patent
Lee et al.

(10) Patent No.: US 8,298,844 B2
(45) Date of Patent: Oct. 30, 2012

(54) METHOD OF FORMING ORGANIC THIN FILM PATTERN AND METHOD OF MANUFACTURING ORGANIC LIGHT-EMITTING DISPLAY DEVICE BY USING THE METHOD OF FORMING ORGANIC THIN FILM PATTERN

(75) Inventors: Kang-Il Lee, Yongin (KR); Yong-Sup Choi, Yongin (KR); Chool-Lae Roh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 85 days.

(21) Appl. No.: 12/963,928

(22) Filed: Dec. 9, 2010

(65) Prior Publication Data
US 2011/0171763 A1    Jul. 14, 2011

(30) Foreign Application Priority Data
Jan. 13, 2010   (KR) .................. 10-2010-0003130

(51) Int. Cl.
    *H01L 21/00*    (2006.01)
(52) U.S. Cl. ............... 438/39; 438/99; 438/149; 216/41
(58) Field of Classification Search ............ 438/39
    See application file for complete search history.

(56) References Cited

U.S. PATENT DOCUMENTS

| | | | |
|---|---|---|---|
| 7,407,846 B2* | 8/2008 | Ando et al. | 438/159 |
| 7,524,431 B2* | 4/2009 | Branton et al. | 216/41 |
| 2001/0002323 A1* | 5/2001 | Kobayashi et al. | 438/156 |
| 2006/0091793 A1* | 5/2006 | Baude et al. | 313/506 |
| 2006/0105492 A1 | 5/2006 | Veres et al. | |
| 2006/0180815 A1* | 8/2006 | Sarma et al. | 257/66 |
| 2008/0018236 A1 | 1/2008 | Arai et al. | |
| 2008/0199984 A1* | 8/2008 | Cok et al. | 438/47 |
| 2009/0251047 A1* | 10/2009 | Lee et al. | 313/504 |
| 2010/0032663 A1* | 2/2010 | Bulovic et al. | 257/40 |

FOREIGN PATENT DOCUMENTS

| | | |
|---|---|---|
| JP | 2005-183782 | 7/2005 |
| KR | 10-2004-0019770 | 3/2004 |
| KR | 10-2005-0032114 | 4/2005 |
| KR | 10-2007-0024285 A | 3/2007 |

(Continued)

OTHER PUBLICATIONS

Johnson et al. "Condensed Gas, In Situ Lithography" available at IP.com as of Feb. 20, 2005 originally published Feb. 1, 1978, pp. 1-3.*

(Continued)

*Primary Examiner* — N Drew Richards
*Assistant Examiner* — Grant Withers
(74) *Attorney, Agent, or Firm* — Christie, Parker & Hale, LLP

(57) ABSTRACT

A method of manufacturing an organic thin film pattern, the method including: forming a dummy organic thin film on a substrate; radiating light on the dummy organic thin film pattern the dummy organic thin film; forming a main organic thin film, having a sublimation temperature is higher than that of the dummy organic thin film, on the substrate and the patterned dummy organic thin film; and heating patterned the dummy organic thin film and the main organic thin film, to sublimate the dummy organic thin film and thereby pattern the main organic thin film.

24 Claims, 14 Drawing Sheets

FOREIGN PATENT DOCUMENTS

| KR | 10-2008-0101842 A | | 10/2007 |
|---|---|---|---|
| KR | 10-2008-0001184 A | | 1/2008 |
| KR | 10-2008-0060400 A | | 7/2008 |
| WO | WO2011/018110 | * | 2/2011 |

OTHER PUBLICATIONS

Cuomo et al. "Selective Deposition with "Dry" Vaporizable Lift-Off Mask" available at IP.com as of Mar. 22, 2005 originally published May 1, 1992, pp. 75-76.*

Machine translation of JP 2005-183782 originally published Jul. 7, 2005.*

Bahlke, Matthias "A Novel Sublimable Mask Lift-Off Method for Patterning Thin Films" Mass. Inst. of Tech. published Feb. 2011, pp. 1-42.*

Chen et al. "Patterning of metallic electrodes on flexible substrates for organic thin-film transistors using a laser thermal printing method" J. Phys. D: Appl. Phys. vol. 44 No. 28 (2011) pp. 1-7.*

KIPO Office action dated Dec. 30, 2011, for Korean priority Patent application 10-2010-0003130, noting listed reference in this IDS, as well as U.S. reference previously submitted in an IDS dated Jul. 22, 2011, 4 pages.

KIPO Office action dated Apr. 26, 2011, for Korean priority Patent application 10-2010-0003130, noting listed references in this IDS, 3 pages.

KIPO Registration Determination Certificate dated Aug. 30, 2012, for Korean priority Patent application 10-2010-0003130, (5 pages).

* cited by examiner

METHOD OF FORMING ORGANIC THIN FILM PATTERN AND METHOD OF MANUFACTURING ORGANIC LIGHT-EMITTING DISPLAY DEVICE BY USING THE METHOD OF FORMING ORGANIC THIN FILM PATTERN

CROSS-REFERENCE TO RELATED APPLICATION

This application claims the benefit of Korean Patent Application No. 10-2010-0003130, filed on Jan. 13, 2010, in the Korean Intellectual Property Office, the disclosure of which is incorporated herein, by reference.

BACKGROUND

1. Field

Aspects of the present invention relate to a method of forming an organic thin film pattern and a method of manufacturing an organic light-emitting display device by using the method.

2. Description of the Related Art

Organic materials are synthesized to have desired electro-optical characteristics and excellent processibility. Thus, they have been considered as material for manufacturing next-generation electronic devices with high performance and low prices. Low-molecular-weight organic materials have been used to manufacture organic light-emitting display devices or the like, via vacuum deposition, using a mask.

FIG. 1 is a schematic cross-sectional view of a conventional vacuum deposition apparatus for forming an organic thin film pattern via deposition using a mask, FIG. 2 is a schematic plan view of the mask of FIG. 1, and FIG. 3 is an enlarged cross-sectional view of the vacuum deposition apparatus, taken along line III of FIG. 1.

Referring to FIGS. 1 through 3, at least one deposition source 13 in which an organic material is vaporized, is disposed in a vacuum chamber 1. A substrate mounting unit 12 is disposed in the vacuum chamber 1 opposite to the deposition source 13. A substrate 11 upon which a deposition material is to be deposited, is mounted on the substrate mounting unit 12, and a mask M having a predetermined pattern is separated from the substrate 11 is aligned with the substrate 11 at a predetermined interval. The vacuum chamber 1 is maintained at a predetermined degree of vacuum, by an exhaust device 14.

The substrate 11 may be rotated, or the deposition source 13 may make a linear reciprocating motion, so as to obtain the uniformity of deposited organic thin films. In order to form an organic thin film pattern on the substrate 11, the mask M has openings $M_1$ (see FIG. 2) in the form of organic thin film patterns P (see FIG. 2). In other words, the organic material is vaporized in the deposition source 13, passes through the openings $M_1$ of the mask M, and is deposited on the substrate 11.

In this case, a shadow S occurs in the organic thin film patterns P, due to a distance d (see FIG. 3) between the mask M and the substrate 11. In addition, as display devices become larger, the increased weight of the mask M causes the same to sag. Thus, it is difficult to form a desired organic thin film pattern having high resolution.

SUMMARY

Aspects of the present invention provide a method of forming an organic thin film pattern, and an organic light-emitting display device manufactured using the method. The method allows for the organic thin film to be manufactured in a simplified manner, with reduced material costs. In addition, the size of the organic thin film pattern can be increased and can have a high resolution.

According to an aspect of the present invention, there is provided a method of manufacturing an organic thin film pattern, the method including: forming a dummy organic thin film on a substrate; radiating light on the dummy organic thin film, to peel off portions of the dummy organic thin film; forming a main organic thin film, having a sublimation temperature that is higher than that of the dummy organic thin film, on the substrate and the portion of the dummy organic thin film that remains in the substrate; and heating the dummy organic thin film and the main organic thin film, to sublimate the dummy organic thin film and to peel off the dummy organic thin film and the portion of the main organic thin film formed on the dummy organic thin film.

According to various embodiments, the forming of the dummy organic thin film may include using a vacuum deposition or coating method.

According to various embodiments, the dummy organic thin film may include at least one material selected from the group consisting of naphthalene, acenaphthalene, pyrene, and fluorene.

According to various embodiments, the forming of the dummy organic thin film on the substrate includes maintaining the substrate at a temperature that is lower than a sublimation temperature of the dummy organic thin film.

According to various embodiments, the radiating of the light on the dummy organic thin film may include radiating laser light on the dummy organic thin film, to pattern the dummy organic thin film.

According to various embodiments, the radiating of the light on the dummy organic thin film may include radiating ultraviolet (UV) light on the dummy organic thin film.

According to various embodiments, the forming of the main organic thin film may include using a vacuum deposition or coating method.

According to various embodiments, the forming of the main organic thin film may include forming multiple main organic thin films having different colors, in a multi-layer structure, so as to emit white light.

According to various embodiments, the heating of the dummy organic thin film and the main organic thin film include heating the same at a temperature that is higher than a sublimation temperature of the dummy organic thin film and lower than a sublimation temperature of the main organic thin film.

According to various embodiments, the substrate may be maintained at a temperature that is higher than the sublimation temperature of the dummy organic thin film and lower than the sublimation temperature of the main organic thin film.

According to various embodiments, the method may further include, forming different main organic thin film patterns in regions where the main organic thin film pattern is not formed.

According to various embodiments, the main organic thin film may include main organic thin film layers having different colors.

According to another asepct of the present invention, there is provided a method of manufacturing an organic light-emitting display device including a first electrode, an opposing second electrode, and an organic layer disposed therebetween, the method including: forming a dummy organic thin film, having a sublimation temperature that is lower than that of the organic layer, on a substrate on which the first electrode is formed; radiating light on the dummy organic thin film, to pattern the dummy organic thin film; forming the organic layer on the first electrode and on the patterned dummy organic thin film; heating the resultant at a temperature that is higher than a sublimation temperature of the dummy organic thin film and lower than a sublimation temperature of the organic layer to the dummy organic thin film and the organic layer, to sublimate the patterned dummy organic thin film and to peel off the portion of the organic layer formed on the patterned dummy organic thin film; and forming a second electrode on the organic layer that remains on the first electrode.

According to various embodiments, the forming of the dummy organic thin film may include using a vacuum deposition or coating method.

According to various embodiments, the dummy organic thin film may include at least one material selected from the group consisting of naphthalene, acenaphthalene, pyrene, and fluorene.

According to various embodiments, the radiating of the light on the dummy organic thin film may include radiating laser light on the dummy organic thin film.

According to various embodiments, the organic layer may include light-emitting layers of different colors, so as to emit white light.

According to various embodiments, the method may further include, forming different organic layer patterns in regions where the organic layer pattern is not formed.

According to various embodiments, the organic layers may have different colors.

According to various embodiments, the organic layers may comprise red R, green G, and blue B light-emitting layers.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION

Figure 1:
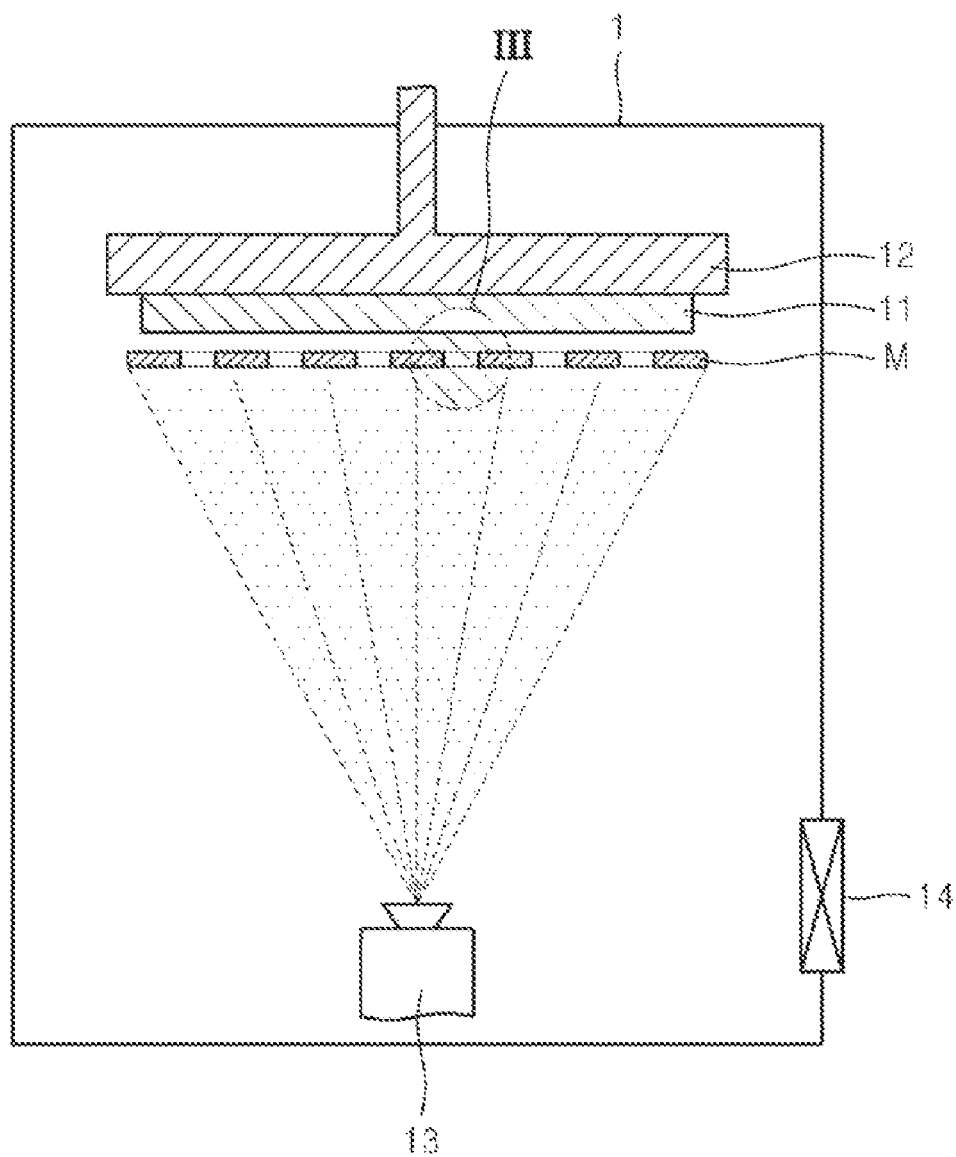
FIG. 1 is a schematic cross-sectional view of a conventional vacuum deposition apparatus for forming an organic thin film pattern via deposition using a mask.
Figure 2:
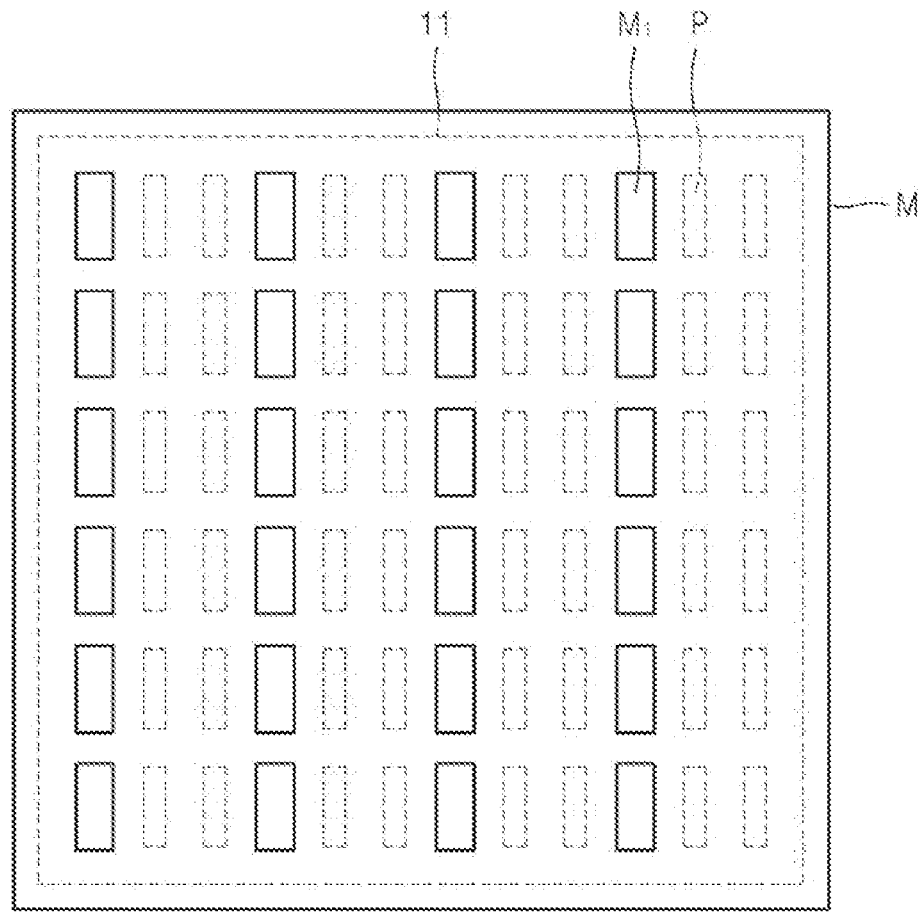
FIG. 2 is a schematic plan view of the shape of a mask of the vacuum deposition apparatus of FIG. 1.
Figure 3:
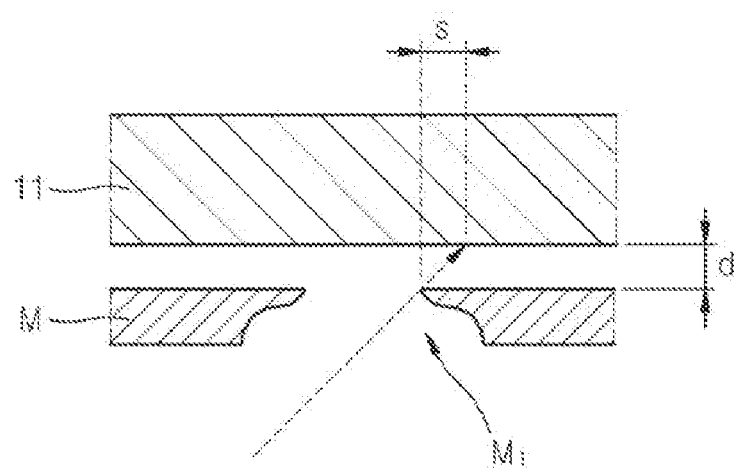
FIG. 3 is an enlarged cross-sectional view of the vacuum deposition apparatus, taken along line III of FIG. 1.

Reference will now be made in detail to the exemplary embodiments of the present invention, examples of which are illustrated in the accompanying drawings, wherein like reference numerals refer to the like elements throughout. The exemplary embodiments are described below, in order to explain the present invention, by referring to the figures.

As referred to herein, when a first element is said to be disposed or formed "on" a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

Figure 4:
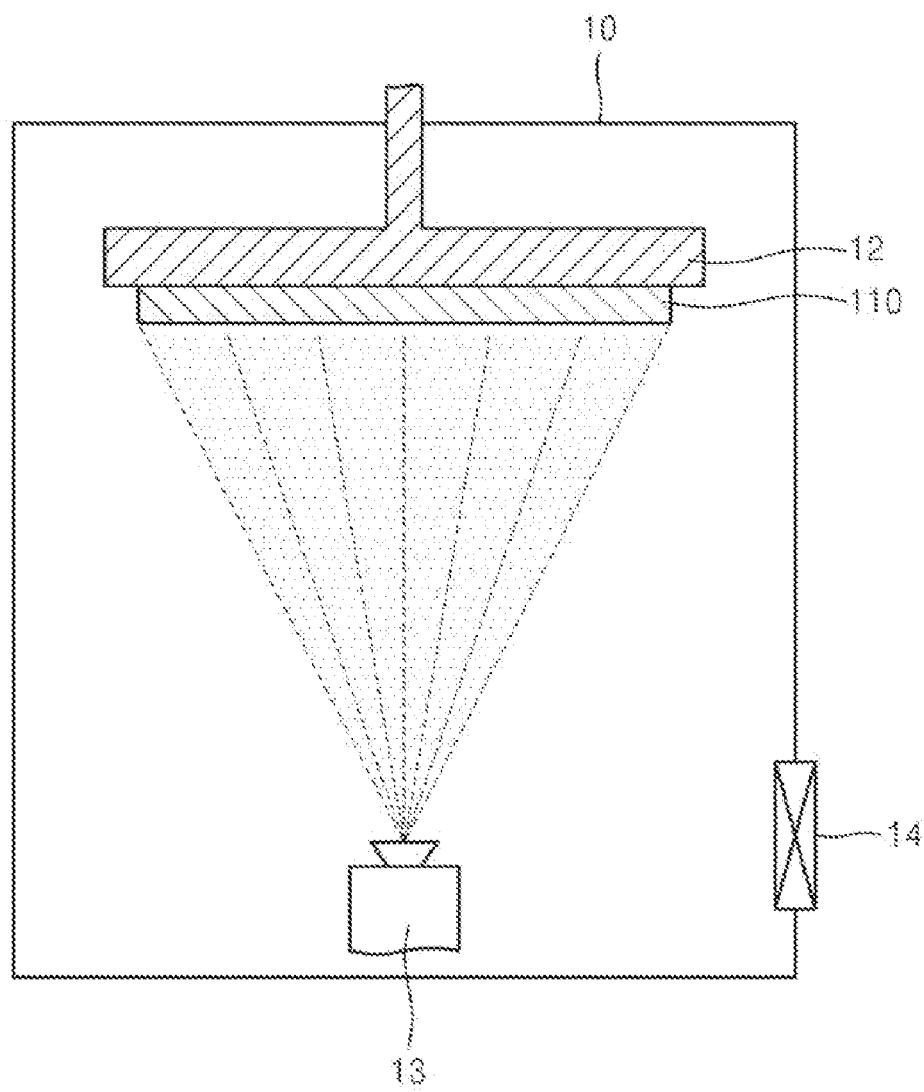
FIGS. 4 through 12 are schematic cross-sectional views of a method of forming an organic thin film pattern, according to an embodiment of the present invention.
Figure 5:

FIGS. 4 through 12 are schematic cross-sectional views of a method of forming an organic thin film pattern, according to an exemplary embodiment of the present invention. Referring to FIGS. 4 and 5, the method includes forming a dummy organic thin film 120 on a substrate 110.

In detail, the substrate 110 is mounted on a substrate mounting unit 12 of a vacuum chamber 10. A deposition source 13, in which material for forming the dummy organic thin film 120 is vaporized, is disposed at an opposite side to the substrate 110. The vacuum chamber 10 is maintained at an appropriate temperature and degree of vacuum by an exhaust device 14, while the material for forming the dummy organic thin film 120 is vaporized and deposited on the substrate 110. The deposition is not limited to the above-described deposition apparatus and may be performed in any suitable apparatus.

The dummy organic thin film 120 includes material having a sublimation temperature that is lower than that of a main organic thin film 130 that will be described later. For example, the dummy organic thin film 120 may include at least one material selected from the group consisting of naphthalene, acenaphthalene, pyrene, and fluorene. The substrate 110 is maintained at a temperature that is lower than the sublimation temperature of the dummy organic thin film 120, so that the dummy organic thin film 120 deposited on the substrate 110 can be maintained in a solid state.

Figure 6:
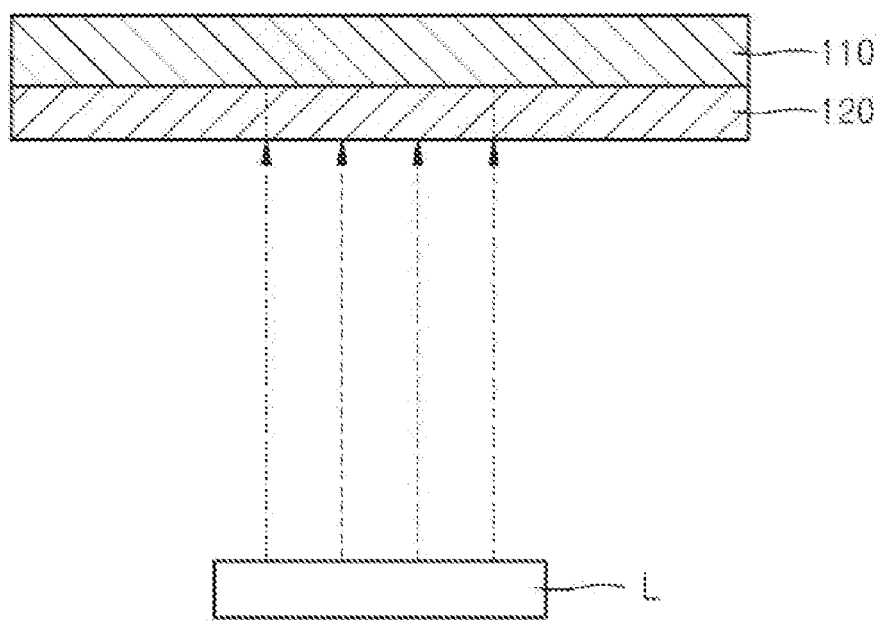
Figure 7:
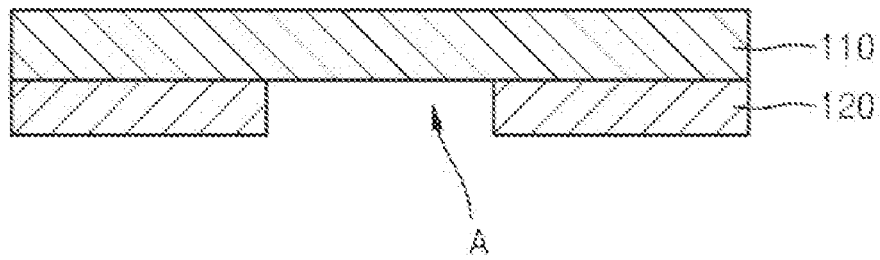

Referring to FIGS. 6 and 7, a predetermined amount of light is radiated on the dummy organic thin film 120, thereby peeling off/sublimating portions of the dummy organic thin film 120, so as to pattern the dummy organic thin film 120. In detail, a laser L is used to irradiate portions of the dummy organic thin film 120. The laser L may be an Excimer laser. The laser light is absorbed by the dummy organic thin film 120, thereby heating the same. The heating peels off/sublimates portions of the dummy organic thin film 120, such as a portion disposed in region A. The present invention is not limited to laser light, as other types of light, for example, ultraviolet (UV) light, may be used.

Figure 8:
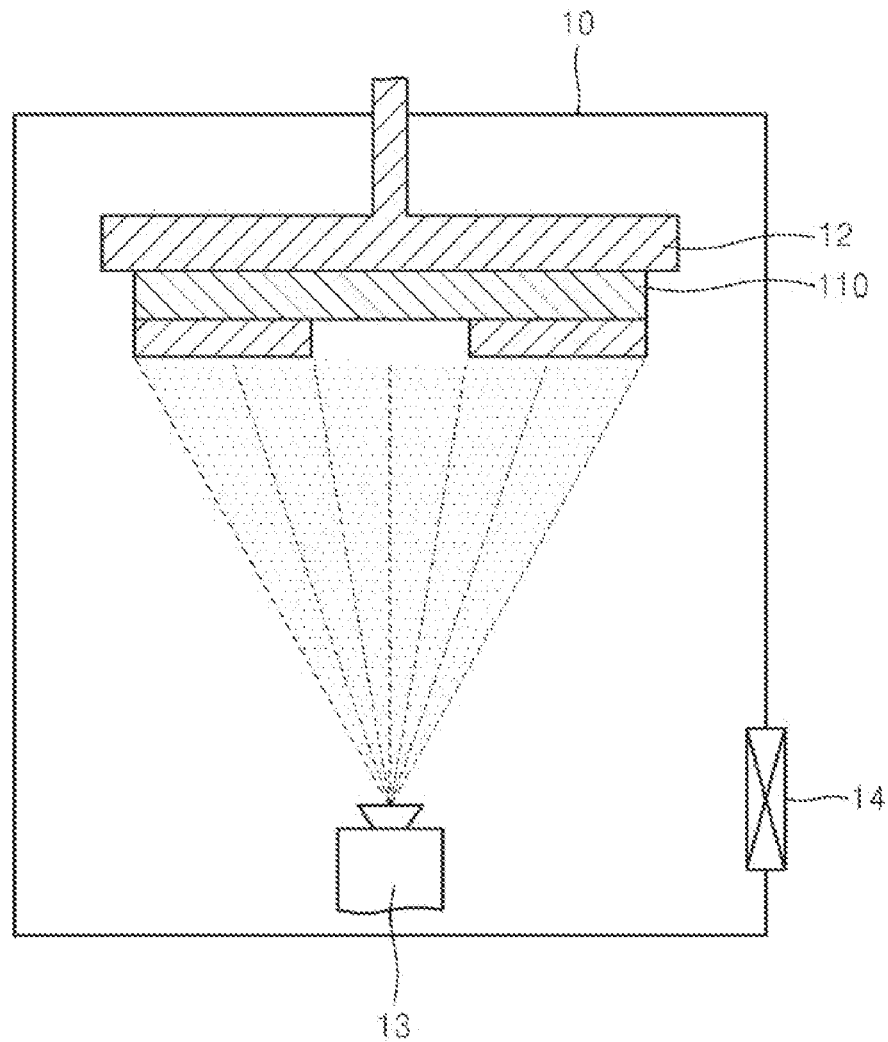
Figure 9:
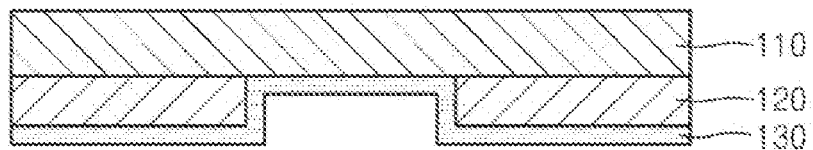

Referring to FIGS. 8 and 9, a main organic thin film 130 is formed on the substrate 110 and on the entire surface of the patterned dummy organic thin film 120. The main organic thin film 130 includes an organic material having a sublimation temperature that is higher than that of the dummy organic thin film 120. An organic layer including a light-emitting layer of an organic light-emitting display device may be used as the main organic thin film 130, as described below.

Forming the main organic thin film 130 may be performed via vacuum deposition. In this case, as described above, the substrate the patterned dummy organic thin film 120, is disposed on the substrate mounting unit 12 in the vacuum chamber 10. The deposition source 13 is used to vaporize a material for forming the main organic thin film 130, which is then disposed on an opposite side to the substrate 110. The vacuum chamber 10 is maintained at an appropriate temperature and degree of vacuum by the exhaust device 14.

Figure 10:
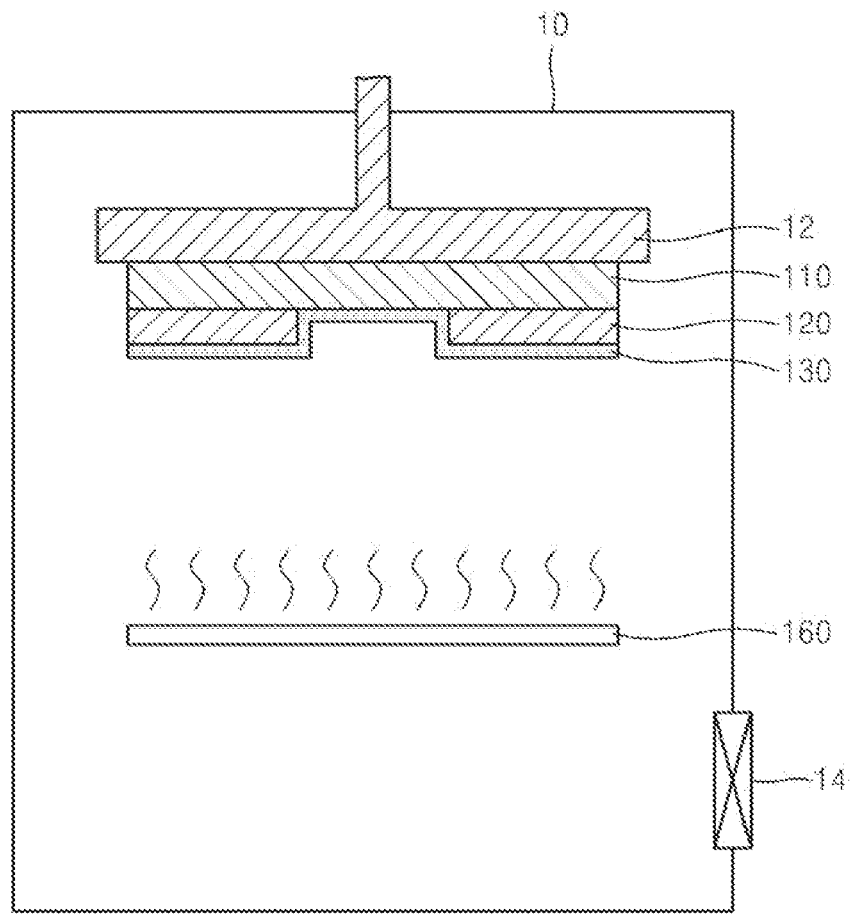
Figure 11:
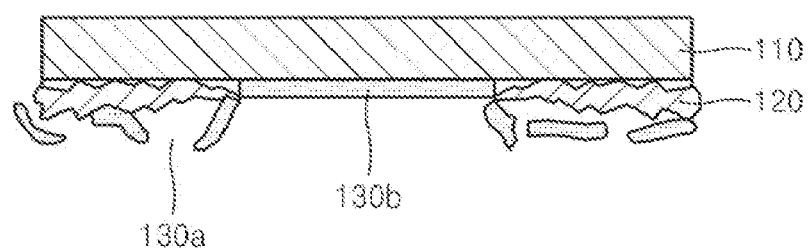
Figure 12:
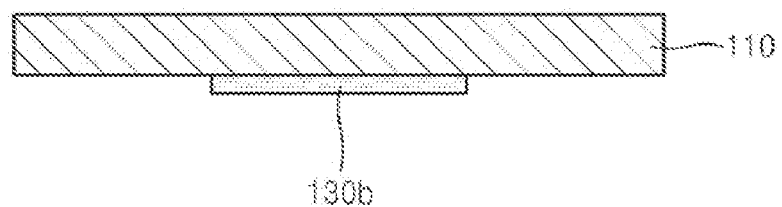

Referring to FIGS. 10 through 12, the dummy organic thin film 120 and the main organic thin film 130 are heated to sublimate the dummy organic thin film 120, thereby peeling off the portions of the main organic thin film 130 formed on the dummy organic thin film 120. In detail, referring to FIG. 10, the substrate 110, on which the main organic thin film 130 is formed, is disposed on the substrate mounting unit 12 of the vacuum chamber 10, and the dummy organic thin film 120 and the main organic thin film 130 are heated by a heater 160 installed at an opposite side to the substrate 110. The heater 160 applies heat having temperature that is higher than the sublimation temperature of the dummy organic thin film 120 and lower than the sublimation temperature of the main organic thin film 130, to the dummy organic thin film 120 and the main organic thin film 130.

Referring to FIG. 11, the heated dummy organic thin film 120 is sublimated and thus, is converted into a gas. Then, a portion 130a of the main organic thin film 130 formed on the dummy organic thin film 120 is peeled off with the dummy organic thin film 120.

Referring to FIG. 12, a portion of the main organic thin film 130 that was not formed on the dummy organic thin film 120 remains on the substrate 110, in the form of a patterned organic thin film 130a. The substrate 110 may be maintained at a temperature that is higher than the sublimation temperature of the dummy organic thin film 120 and lower than the sublimation temperature of the main organic thin film 130.

In FIGS. 4 through 12, vacuum deposition is used to form the dummy organic thin film 120 and the main organic thin film 130. However, aspects of the present invention are not limited thereto. For example, the dummy organic thin film 120 and the main organic thin film 130 may be formed via a coating method.

In the method of forming the organic thin film pattern of FIGS. 4 through 12, a mask is not used to form the organic thin film pattern. Thus, costs for forming and maintaining a mask are not incurred.

In addition, when a mask is used, it is difficult to form a high-resolution organic thin film pattern, due to heat deformation of the mask, sagging of the mask, or the like. However, according to aspects of the present invention, a mask does not need to be used, as the radiation of the light is controlled to form the organic thin film pattern, such that high-resolution organic thin film patterns can be formed.

Figure 13:
FIGS. 13 through 24 are schematic cross-sectional views of a method of forming an organic thin film pattern, according to an embodiment of the present invention.

FIGS. 13 through 24 are schematic cross-sectional views of a method of forming an organic thin film pattern, according to an exemplary embodiment of the present invention. Referring to FIG. 13, a dummy organic thin film 220 is formed on a substrate 210.

A material having a sublimation temperature that is lower than sublimation temperatures of organic thin films 230, 240, and 250, which will be described later, is used to form the dummy organic thin film 220. For example, naphthalene may be used as the material. The substrate 210 is maintained at a temperature that is lower than the sublimation temperature of the dummy organic thin film 220. The dummy organic thin film 220 may be formed via vacuum deposition or coating methods, as described above.

Figure 14:
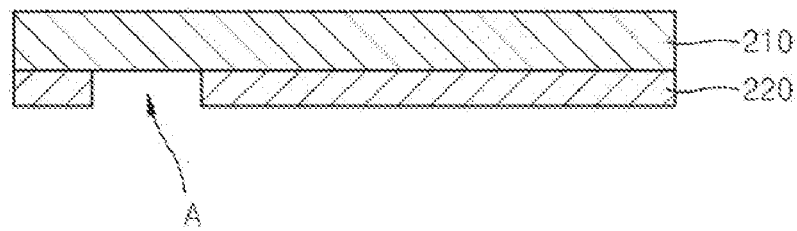
Figure 15:
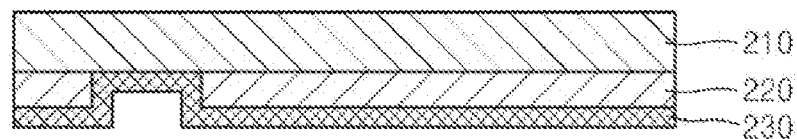

Referring to FIG. 14, light, such as laser light or the like (not shown), is radiated on a region A of the dummy organic thin film 220, thereby sublimating the dummy organic thin film 220 to pattern the dummy organic thin film 220. Referring to FIG. 15, a first main organic thin film 230 is formed on the exposed portions of the substrate 210 and on the entire surface of the patterned dummy organic thin film 220 remaining on the substrate 210.

The first main organic thin film 230 includes an organic material having a sublimation temperature that is higher than that of the dummy organic thin film 220. The first main organic thin film 230 may be an organic light-emitting layer of an organic light-emitting display device. For example, the organic layer may be a red light-emitting layer.

Figure 16:
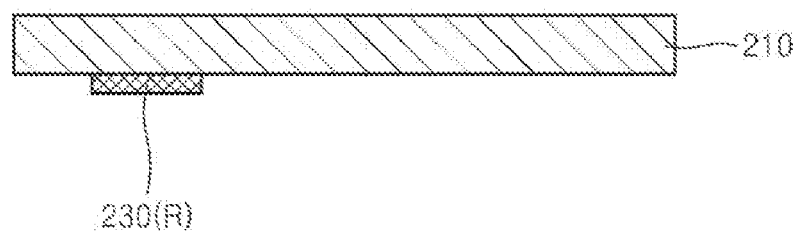

Referring to FIG. 16, the dummy organic thin film 220 and the first main organic thin film 230 are heated to sublimate the dummy organic thin film 220 and thereby peel off the portions of the first main organic thin film 230 formed on the dummy organic thin film 220. In this case, the films 220, 230 are heated at a temperature that is higher than the sublimation temperature of the dummy organic thin film 220 and lower than the sublimation temperature of the first main organic thin film 230, to sublimate the dummy organic thin film 220 and peel off the portions of the first main organic thin film 230 formed on the dummy organic thin film 220, thereby obtaining a desired first main organic thin film pattern 230(R). The substrate 210 may be maintained at a temperature that is higher than the sublimation temperature of the dummy organic thin film 220 and lower than the sublimation temperature of the first main organic thin film 230.

Figure 17:
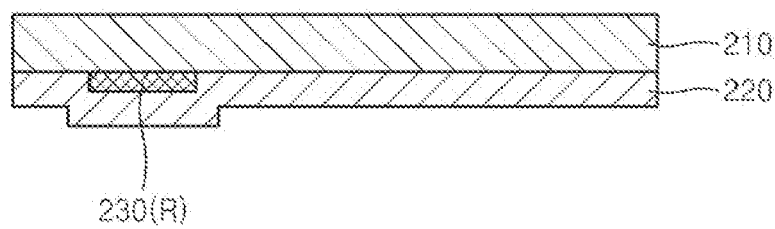
Figure 18:
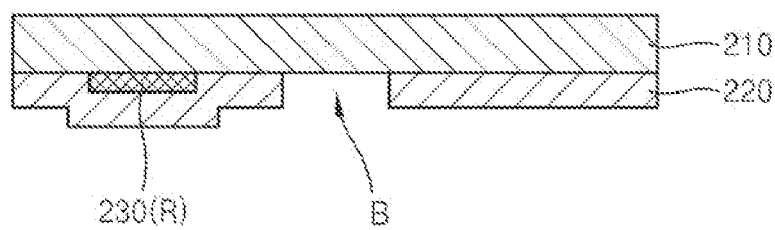

Referring to FIG. 17, a dummy organic thin film 220 is again formed on the exposed portions of the substrate 210 and the first main organic thin film pattern 230(R). Referring to FIG. 18, light is radiated on a region B of the dummy organic thin film 220, where the first main organic thin film pattern 230(R) is not formed, thereby sublimating the dummy organic thin film 220, to pattern the dummy organic thin film 220.

Figure 19:
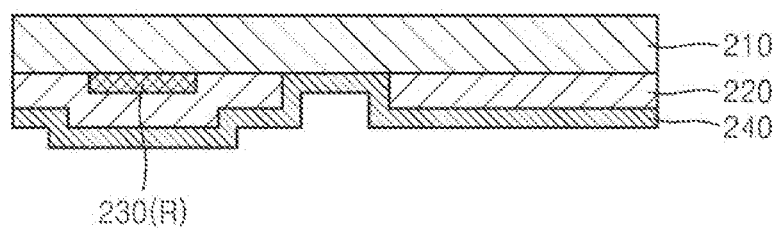

Referring to FIG. 19, a second main organic thin film 240 is formed on the exposed portions of the substrate 210 and the dummy organic thin film 220. The second main organic thin film 240 includes an organic material having a sublimation temperature that is higher than that of the dummy organic thin film 220. The second main organic thin film 240 may be an organic light-emitting layer of the organic light-emitting display device. For example, the organic layer may be a green light-emitting layer.

Figure 20:
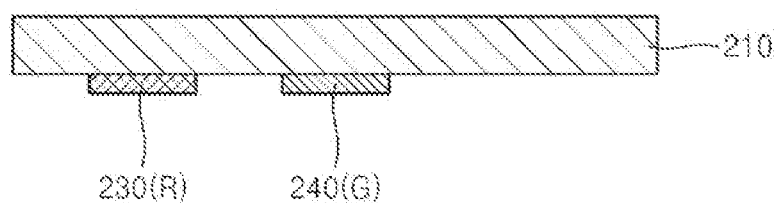

Referring to FIG. 20, the dummy organic thin film 220 and the second main organic thin film 240 are heated to sublimate the dummy organic thin film 220, thereby peeling off the portions of the second main organic thin film 240 formed on the dummy organic thin film 220. The films 220, 240 are heated at a temperature that is higher than the sublimation temperature of the dummy organic thin film 220 and lower than the sublimation temperature of the second main organic thin film 240, thereby obtaining a desired second main organic thin film pattern 240(G). The substrate 210 may be maintained at a temperature that is higher than the sublimation temperature of the dummy organic thin film 220 and lower than the sublimation temperature of the second main organic thin film 240.

Figure 21:
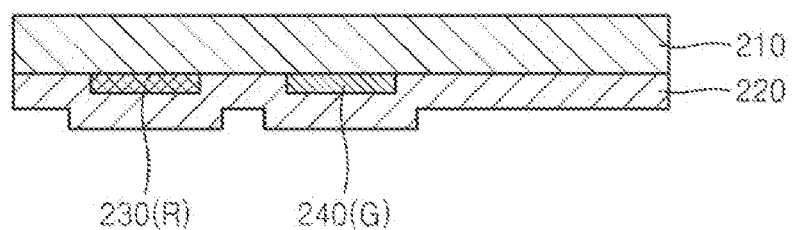
Figure 22:
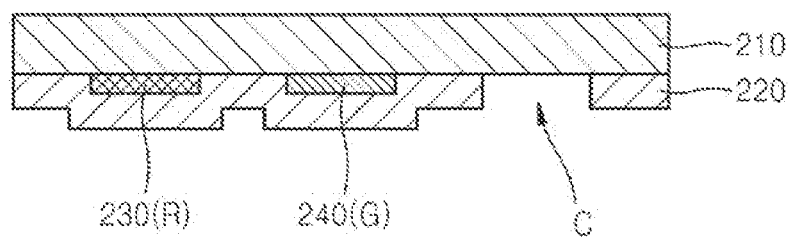

Referring to FIG. 21, a dummy organic thin film 220 is again formed on the exposed portions of the substrate 210, the first main organic thin film pattern 230(R), and the second main organic thin film pattern 240(G). Referring to FIG. 22, light is radiated on a region C of the dummy organic thin film 220, where the first main organic thin film pattern 230(R) and the second main organic thin film pattern 240(G) are not formed, thereby sublimating portions of the dummy organic thin film 220, to pattern the dummy organic thin film 220.

Figure 23:
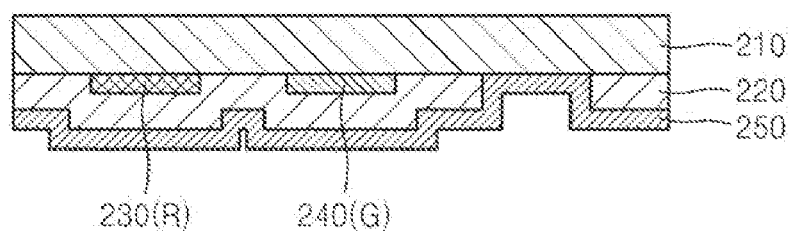

Referring to FIG. 23, a third main organic thin film 250 is formed on the exposed portions of the substrate 210 and the entire dummy organic thin film pattern 220. The third main organic thin film 250 includes an organic material having a sublimation temperature that is higher than that of the dummy organic thin film 220. The third main organic thin film 250 may be an organic light-emitting layer of the organic light-emitting display device. For example, the organic layer may be a blue light-emitting layer.

Figure 24:
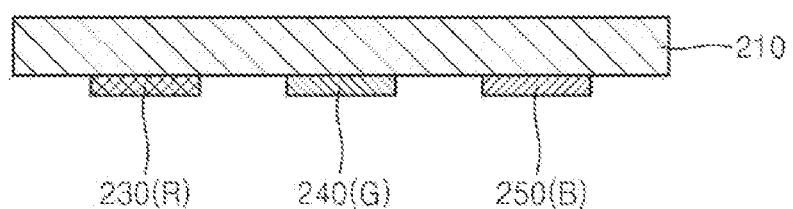

Referring to FIG. 24, the dummy organic thin film 220 and the third main organic thin film 250 are heated to sublimate the dummy organic thin film 220, thereby peeling off the portions of the third main organic thin film 250 formed on the dummy organic thin film 220. In this case, the films 220, 250 are heated at a temperature that is higher than the sublimation temperature of the dummy organic thin film 220 and lower than the sublimation temperature of the third main organic thin film 250, thereby obtaining a desired third main organic thin film pattern 250(B). The substrate 210 may be maintained at a temperature that is higher than the sublimation temperature of the dummy organic thin film 220 and lower than the sublimation temperature of the third main organic thin film 250.

In FIGS. 13 through 24, the depositing, radiating, and heating operations are repeatedly performed, so that the first, second, and third main organic thin film patterns 230(R), 240(G), 250(B) can be formed. An organic light-emitting display device including different color organic light-emitting layers can be manufactured using the above method.

Figure 25:
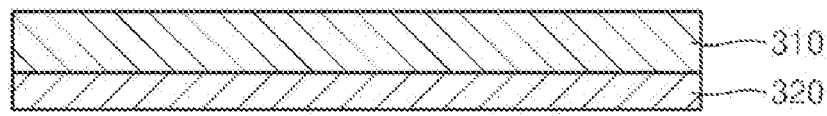
FIGS. 25 through 28 are schematic cross-sectional views of a method of forming an organic thin film pattern, according to an embodiment of the present invention.

FIGS. 25 through 28 are schematic cross-sectional views of a method of forming an organic thin film pattern, according to an exemplary embodiment of the present invention. Referring to FIG. 25, a dummy organic thin film 320 is formed on a substrate 10. The substrate 310 is maintained at a temperature that is lower than the sublimation temperature of the dummy organic thin film 320.

Figure 26:
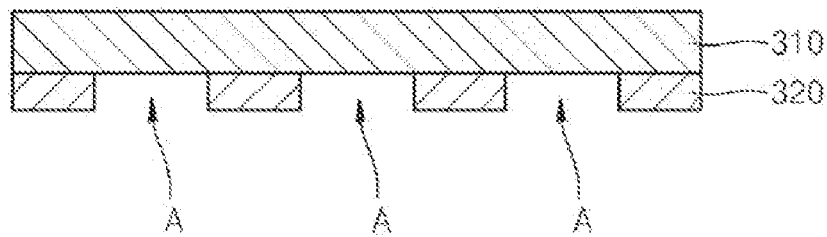
Figure 27:
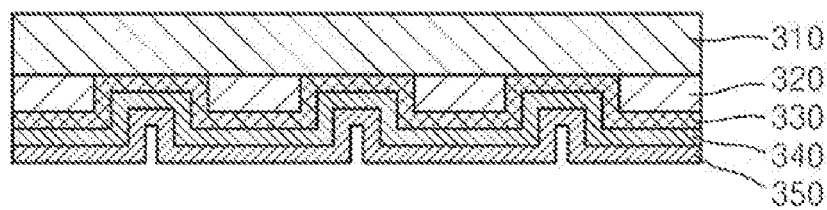

Referring to FIG. 26, light is radiated on a region A of the dummy organic thin film 320, thereby sublimating portions of the dummy organic thin film 320, to pattern the dummy organic thin film 320. Referring to FIG. 27, a first main organic thin film 330, a second main organic thin film 340, and a third main organic thin film 350 are sequentially formed on the substrate 310 and on the entire surface of the patterned dummy organic thin film 320.

The first main organic thin film 330, the second main organic thin film 340, and the third main organic thin film 350 each include an organic material having a sublimation temperature that is higher than that of the dummy organic thin film 320. The main organic thin films 330, 340, 350 may together from a white light-emitting layer of an organic light-emitting display device. For example, the main organic thin films 330, 340, 350 may be red, green, and blue organic light-emitting layers that are stacked on one another, in any order.

Figure 28:
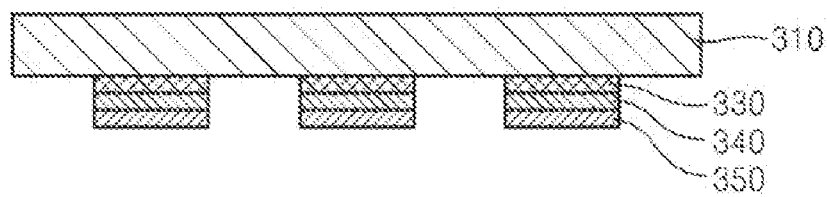

Referring to FIG. 28, the dummy organic thin film 320 and the main organic thin films 330, 340, 350 are heated to sublimate the dummy organic thin film 320, thereby peeling off portions of the main organic thin films 330, 340, 350 disposed thereon.

The main organic thin films 320, 330, 340, 350 are heated at a temperature that is higher than the sublimation temperature of the dummy organic thin film 320 and lower than sublimation temperatures of the main organic thin films 330, 340, 350. As such, the organic thin films 330, 340, 350 are patterned, so as to operate together as white light-emitting layers.

The substrate 310 may be maintained at a temperature that is higher than the sublimation temperature of the dummy organic thin film 320 and lower than the sublimation temperatures of the main organic thin films 330, 340, 350. In FIGS. 25 through 28, main organic thin film patterns having different colors may be formed in a multi-layer structure, so that the organic light-emitting display device can be manufactured.

FIGS. 29 through 34 are schematic plan views of a method of forming an organic thin film patterns, according to an exemplary embodiment of the present invention. In detail, FIGS. 29 through 34 are schematic plan views of a method of forming main organic thin film patterns on a mother substrate 410 in cells (not in units of pixels), in a method of manufacturing an organic light-emitting display device including a plurality of stacked main organic thin film patterns, as illustrated in FIGS. 25 through 28. The mother substrate 410 is a substrate that is prepared to manufacture a plurality of unit organic light-emitting display devices, and the cells are unit organic light-emitting display devices.

Figure 29:
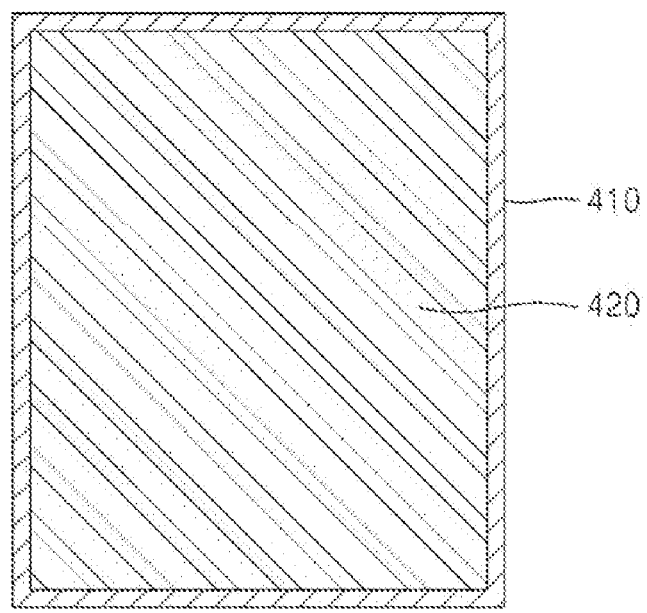
FIGS. 29 through 34 are schematic cross-sectional views of a method of forming an organic thin film pattern, according to an embodiment of the present invention.
Figure 30:
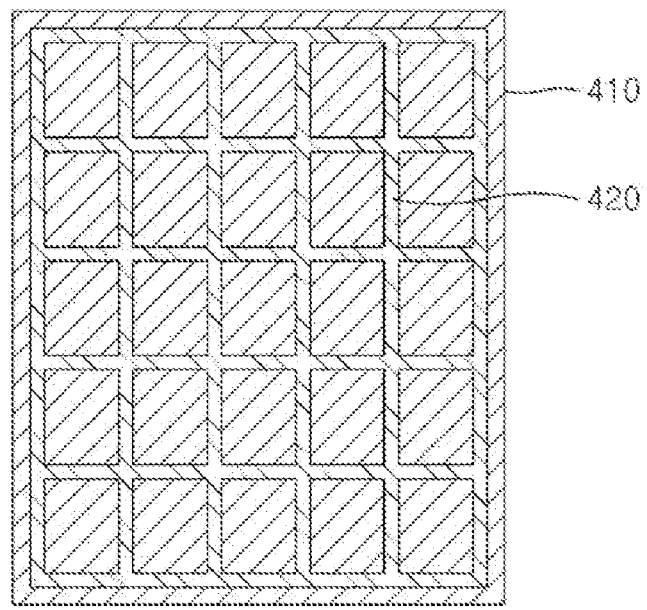

Referring to FIG. 29, a dummy organic thin film 420 is formed on the mother substrate 410. The mother substrate 410 is maintained at a temperature that is lower than the sublimation temperature of the dummy organic thin film 420. Referring to FIG. 30, light is radiated on a region A of the dummy organic thin film 420, thereby sublimating portions of the dummy organic thin film 420, to pattern the dummy organic thin film 420.

Figure 31:
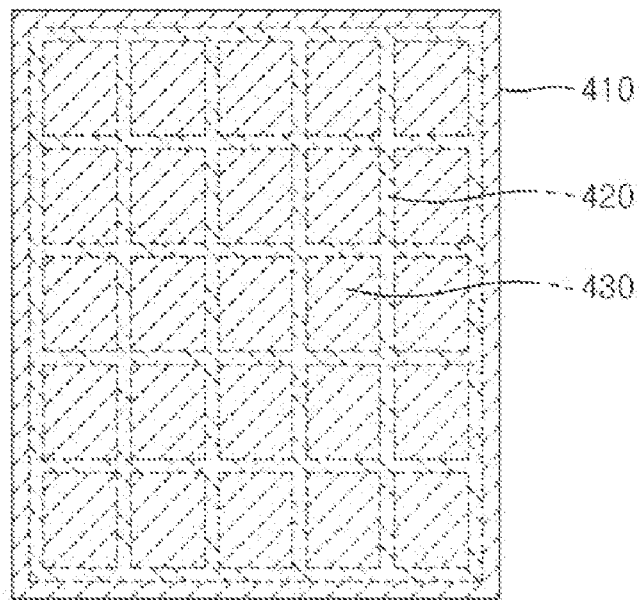
Figure 32:
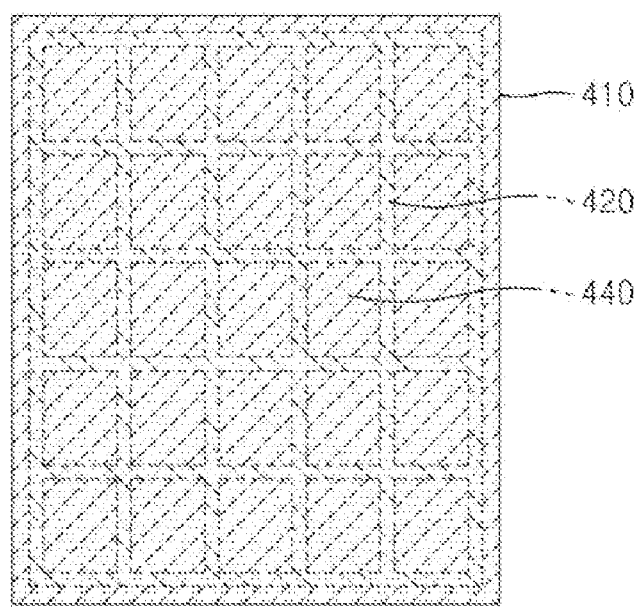

Referring to FIG. 31, a first main organic thin film 430 is formed on the mother substrate 410 and on the entire surface of the patterned dummy organic thin film 420. Referring to FIG. 32, a second main organic thin film 440 is formed on the first main organic thin film 430.

Figure 33:
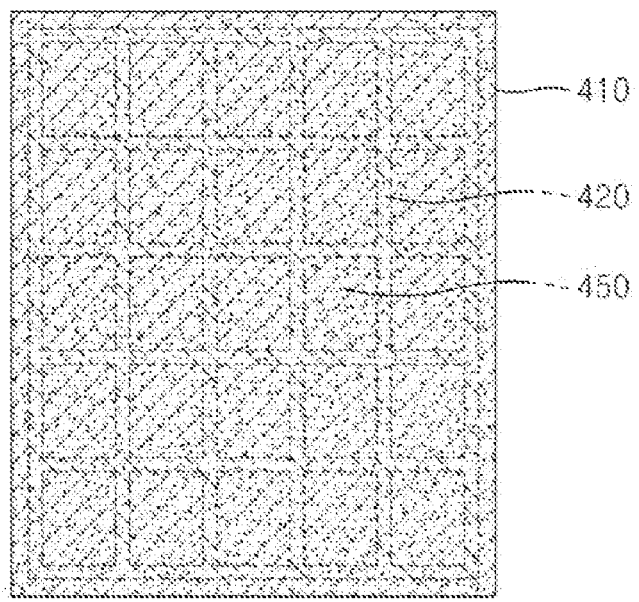

Referring to FIG. 33, a third main organic thin film 450 is formed on the second main organic thin film 440. The main organic thin films 430, 440, 450 each include an organic material having a sublimation temperature that is higher than that of the dummy organic thin film 420.

Figure 34:
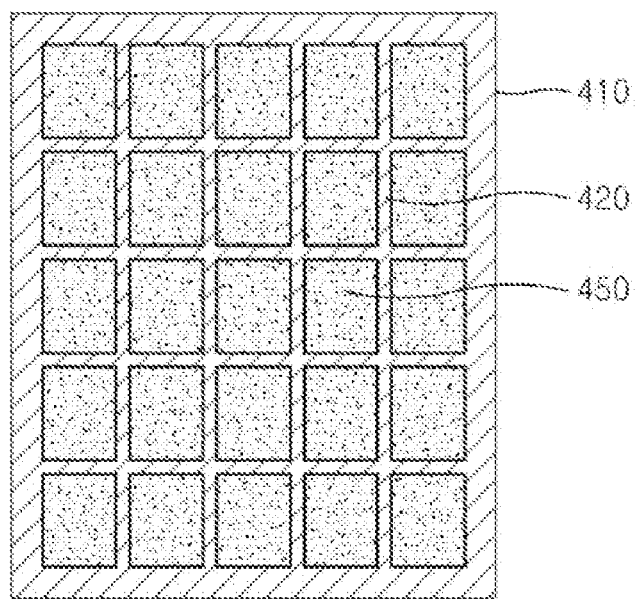

Referring to FIG. 34, the dummy organic thin film 420 and the main organic thin films 430, 440, 450 are heated to sublimate the dummy organic thin film 420. Accordingly, portions of the films 430, 440, 450 formed on the dummy organic thin film 420 are peeled off, thereby patterning the same. The films 420, 430, 440, 450 are heated at a temperature that is higher than the sublimation temperature of the dummy organic thin film 420 and lower than the sublimation temperatures of the 430, 440, 450.

The mother substrate 410 may be maintained at a temperature that is higher than the sublimation temperature of the dummy organic thin film 420 and lower than sublimation temperatures of the main organic thin films 430, 440, 450. The main organic thin films 430, 440, 450 may operate together as white light-emitting layers of the organic light-emitting display device. For example, the main organic thin films 430, 440, 450 may be red, green, and blue organic light-emitting layers, which may be stacked together, in any order.

The main organic thin films 430, 440, 450 may operate as function layers of the organic light-emitting display device. For example, the main organic thin films 430, 440, 450 may include function layers, such as a hole injection layer (HIL), a hole transport layer (HTL), an electron transport layer (ETL), and an electron injection layer (EIL).

In FIGS. 29 through 34, the main organic thin films 430, 440, 450 are disposed in three-layers. However, the present invention is not limited to any particular number or arrangement of such layers. For example, different types and/or numbers of main organic thin films may be used. The above-described method of forming the organic thin film pattern may be applied to form an organic layer of the organic light-emitting display device, as described below.

Figure 35:
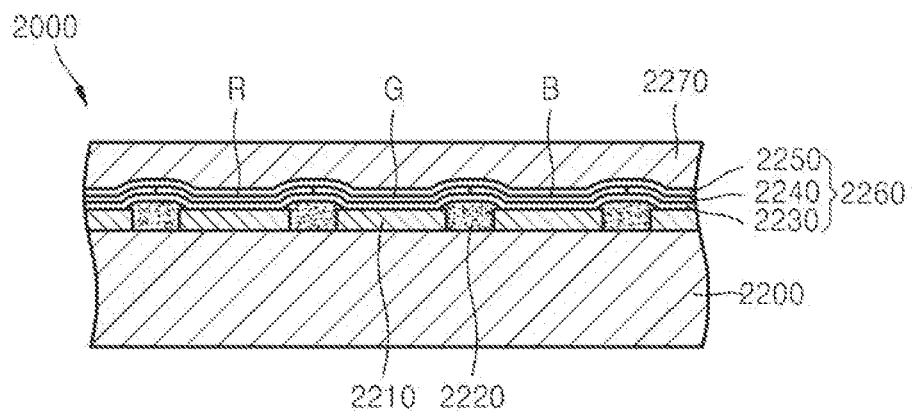
FIG. 35 is a schematic cross-sectional view of a passive matrix (PM) organic light-emitting display device, according to an embodiment of the present invention.

FIG. 35 is a schematic cross-sectional view of a passive matrix (PM) organic light-emitting display device 2000, according to an exemplary embodiment of the present invention. Referring to FIG. 35, a first electrode layer 2210 is formed on a substrate 2200, in a striped pattern. An organic layer 2260, including a light-emitting layer 2240 and a second electrode layer 2270, is formed on the first electrode layer 2210. An insulation layer 2220 may be further disposed between lines of the first electrode layer 2210. The second electrode layer 2270 may be formed in a pattern that is perpendicular to the pattern of the first electrode layer 2210.

The light-emitting layer 2240 includes red R, green G, and blue B light-emitting layers, to create full color images. The light emitting layer may be formed using the methods of FIGS. 4 through 34.

The organic layer 2260 may include a low-molecular-weight organic layer or a high-molecular-weight organic layer. When a low-molecular-weight organic layer is used as the organic layer 2260, the organic layer 2260 may have a single or multi-layer structure, including at least one selected from the group consisting of a hole injection layer (HIL), a hole transport layer (HTL), an emission layer (EML), an electron transport layer (ETL), and an electron injection layer (EIL), as exemplified by elements 2230 and 2250. Examples of available organic materials include copper phthalocyanine (CuPc), N,N'-di(naphthalene-1-yl)-N,N'-diphenyl-benzidine (NPB), tris-8-hydroxyquinoline aluminum (Alq3) or the like.

When a high-molecular-weight organic layer is included in the organic layer 2260, the organic layer 2260 may include a HTL extending in a direction of an anode, based on the light-emitting layer 2240. Examples of available organic materials for forming the high-molecular-weight HTL include poly-(2,4)-ethylene-dihydroxy thiophene (PEDOT) and polyaniline (PANI). Examples of available organic materials for forming the high-molecular-weight light-emitting layer 2240 include PPV, soluble PPV's, Cyano-PPV, polyfluorene, or the like.

Figure 36:
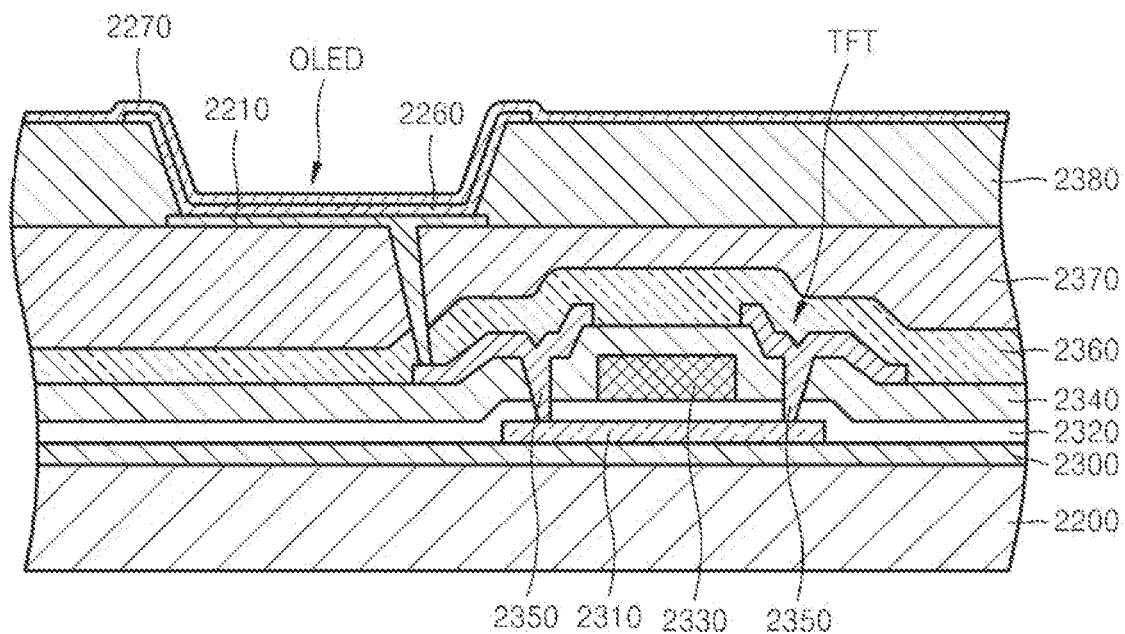
FIG. 36 is a schematic cross-sectional view of an active matrix (AM) organic light-emitting display device, according to an embodiment of the present invention.

FIG. 36 is a schematic cross-sectional view of an active matrix (AM) organic light-emitting display device, according to an exemplary embodiment of the present invention. A subpixel includes at least one thin film transistor (TFT) and an organic light-emitting diode (OLED) that is a self-luminescent diode. However, the subpixel is not limited to the structure illustrated in FIG. 36, as the number and structure of the TFTs may be modified in various ways.

The AM organic light-emitting display device of FIG. 36 will now be explained in detail. A buffer layer 2300 formed of $S_iO_2$, $S_iN_x$, or the like may be disposed on a substrate 2200, and a TFT may be disposed on the buffer layer 2300.

The TFT may include a semiconductor active layer 2310 disposed on the buffer layer 2300, a gate insulating layer 2320 covering the active layer 2310, and a gate electrode 2330 disposed on the gate insulating layer 2320. An interlayer insulating layer 2340 may cover the gate electrode 2330. Source and drain electrodes 2350 may be disposed on the interlayer insulating layer 2340. The source and drain electrodes 2350 may respectively contact a source region and a drain region of the semiconductor active layer 2310, through contact holes formed in the interlayer insulating layer 2340 and the gate insulating layer 2320. The semiconductor active layer 2310 may be an inorganic semiconductor or an organic semiconductor.

A passivation layer 2360, formed of $S_iO_2$, $S_iN_x$, or the like, may be disposed on the source and drain electrodes 2350. A planarization layer 2370, formed of acryl, polyimide, or the like, may be disposed on the passivation layer 2360. Although not shown, the TFT may be connected to at least one capacitor.

The source and drain electrodes 2350 may be connected to the OLED. The source and drain electrodes 2350 may be connected to a first electrode layer 2210 that is an anode of the OLED. The first electrode layer 2210 may be disposed on the planarization layer 2370, and a pixel defining layer 2380 may cover the first electrode layer 2210. After a predetermined opening is formed in the pixel defining layer 2380, the OLED may be formed.

The OLED emits red, green, or blue light, according to a current flow related to image information. The OLED includes the first electrode layer 2210 that is connected to the source and drain electrodes 2350 of the TFT and is supplied positive power therefrom, the second electrode layer 2270 that covers whole pixels and is supplied negative power therefrom, and the organic layer 2260 that is disposed between the first electrode layer 2210 and the second layer 2270 and emits light.

The AM organic light-emitting display device may be formed using the organic thin film patterning methods of FIGS. 4 through 34. In particular, the organic layer 2260 or the EML of the organic layer 2260, may be formed using any one of the present methods, thereby realizing a high precision display device.

As described above, in a method of manufacturing an organic light-emitting display device, according to the present disclosure, a mask is not used to form an organic thin film pattern. Thus, costs associated with manufacturing and maintaining a mask are not incurred. In addition, when a mask is used it is difficult to form a high-resolution organic thin film pattern, due to heat deformation of the mask and the mechanical strength of the mask. However, according to aspects of the present invention, a light source, such as laser, is used to selectively form the shape of the organic thin film pattern, so that a high-resolution organic thin film pattern can be formed.

In addition, when red, green, and blue organic light-emitting layers are formed via vacuum mask deposition methods, the mask may be deformed by heat, so that some distance between a substrate and a deposition source should be maintained. Thus, deposition efficiency is lowered and material costs are increased. However, according to aspects of the present invention, the distance between the substrate and the deposition source can be reduced, as compared to the vacuum mask deposition methods.

The method of forming an organic thin film pattern and the method of manufacturing an organic light-emitting display device using the method, according to aspects of the present invention, have the following effects. First, the mask is not used to form the organic thin film pattern, which reduces manufacturing costs.

Second, light is selectively applied to pattern the organic thin films, such that high-resolution organic thin film patterns can be formed. Third, the distance between the substrate and the deposition source can be reduced, as compared to vacuum mask deposition methods. As a result, deposition efficiency is improved, and material costs are be reduced.

Although a few exemplary embodiments of the present invention have been shown and described, it would be appreciated by those skilled in the art that changes may be made in these exemplary embodiments without departing from the principles and spirit of the invention, the scope of which is defined in the claims and their equivalents.

What is claimed is:

1. A method of manufacturing an organic thin film pattern, comprising:
   forming a dummy organic thin film on a substrate;
   radiating light on the dummy organic thin film, to pattern the dummy organic thin film;
   forming a main organic thin film on the patterned dummy organic thin film and exposed portions of the substrate; and
   heating the patterned dummy organic thin film and the main organic thin film, to sublimate the dummy organic thin film and pattern the main organic thin film,
   wherein the sublimation temperature of the main organic thin film is higher than the sublimation temperature of the dummy organic thin film.

2. The method of claim 1, wherein the dummy organic thin film is formed via a vacuum deposition method.

3. The method of claim 1, wherein the dummy organic thin film is formed via a coating method.

4. The method of claim 1, wherein the dummy organic thin film comprises at least one material selected from the group consisting of naphthalene, acenaphthalene, pyrene, and fluorene.

5. The method of claim 1, wherein, during the forming of the dummy organic thin film, the substrate is maintained at a temperature that is lower than the sublimation temperature of the dummy organic thin film.

6. The method of claim 1, wherein the radiating of the light on the dummy organic thin film comprises using laser light to sublimate portions of the dummy organic thin film.

7. The method of claim 1, wherein the radiating of the light on the dummy organic thin film comprises using ultraviolet (UV) light to sublimate portions of the dummy organic thin film.

8. The method of claim 1, wherein the main organic thin film is formed via a vacuum deposition method.

9. The method of claim 1, wherein the main organic thin film is formed via a coating method.

10. The method of claim 1, wherein the forming of the main organic thin film comprises forming a plurality of stacked light-emitting layers, each having a different color, such that the main organic thin film emits white light.

11. The method of claim 1, wherein the heating of the dummy organic thin film and the main organic thin film comprises heating the dummy and main organic thin films at a temperature that is higher than the sublimation temperature of the dummy organic thin film and lower than the sublimation temperature of the main organic thin film.

12. The method of claim 1, wherein the substrate is maintained at a temperature that is higher than the sublimation temperature of the dummy organic thin film and lower than the sublimation temperature of the main organic thin film, during the heating of the patterned dummy organic thin film and the main organic thin film.

13. The method of claim 1, wherein the heating of the patterned dummy organic thin film and the main organic thin film comprises sublimating the dummy organic thin film, to peel off portions of the main organic thin film disposed thereon.

14. The method of claim 1, further comprising repeating the forming of the dummy organic thin film, the forming of the main organic thin film, and the heating, so as to form a plurality of the main organic thin films on the substrate.

15. The method of claim 14, wherein the main organic thin films comprise light-emitting layers having different colors.

16. A method of manufacturing an organic light-emitting display device comprising a substrate, a first electrode disposed on the substrate, and an opposing second electrode, the method comprising:
   forming a dummy layer on the substrate on which the first electrode is formed;
   radiating light on the dummy layer to pattern the dummy layer;
   forming an organic layer on the first electrode and on the patterned dummy layer;
   heating the patterned dummy layer and the organic layer at a temperature that is higher than the sublimation temperature of the dummy layer and lower than the sublimation temperature of the organic layer, to sublimate the dummy layer and pattern the organic layer; and
   forming the second electrode on the patterned organic layer.

17. The method of claim 16, wherein the dummy layer is formed via a vacuum deposition or coating method.

18. The method of claim 16, wherein the dummy layer comprises at least one material selected from the group consisting of naphthalene, acenaphthalene, pyrene, and fluorene.

19. The method of claim 16, wherein the radiating of the light on the dummy layer comprises radiating laser light on the dummy layer.

20. The method of claim 16, wherein the organic layer comprises stacked light-emitting layers having different colors, so as to emit white light.

21. The method of claim 16, further comprising, repeating the forming of a dummy layer, the forming of the organic layer, and the heating, so as to form a plurality of the organic layers on the substrate, in various patterns.

22. The method of claim 21, wherein the organic layers comprise light-emitting layers having different colors.

23. The method of claim 22, wherein the light-emitting layers comprise red R, green G, and blue B light-emitting layers.

24. The method of claim 16, wherein heating of the patterned dummy layer and the organic layer comprises sublimating the dummy layer, to peel off portions of the organic layer disposed thereon.

* * * * *